United States Patent
Braganca

(10) Patent No.: US 10,719,298 B1
(45) Date of Patent: Jul. 21, 2020

(54) SYSTEM FOR GENERATING RANDOM NOISE WITH A MAGNETIC DEVICE

(71) Applicant: Western Digital Technologies, Inc., San Jose, CA (US)

(72) Inventor: Patrick Braganca, San Jose, CA (US)

(73) Assignee: Western Digital Technologies, Inc., San Jose, CA (US)

(*) Notice: Subject to any disclaimer, the term of this patent is extended or adjusted under 35 U.S.C. 154(b) by 0 days.

(21) Appl. No.: 16/284,613

(22) Filed: Feb. 25, 2019

(51) Int. Cl.
| | |
|---|---|
| G11C 11/00 | (2006.01) |
| G06F 7/58 | (2006.01) |
| H01F 10/08 | (2006.01) |
| H01L 43/08 | (2006.01) |
| G11C 11/16 | (2006.01) |

(52) U.S. Cl.
CPC ............. *G06F 7/588* (2013.01); *G11C 11/16* (2013.01); *H01F 10/08* (2013.01); *H01L 43/08* (2013.01)

(58) Field of Classification Search
CPC ........... G06F 7/588; H01F 10/08; H01L 43/08
See application file for complete search history.

(56) References Cited

U.S. PATENT DOCUMENTS

| | | | |
|---|---|---|---|
| 7,589,600 B2* | 9/2009 | Dimitrov | H03B 15/006 331/94.1 |
| 8,164,861 B2 | 4/2012 | Braganca et al. | |
| 8,495,118 B2 | 7/2013 | Wang et al. | |
| 8,675,309 B2 | 3/2014 | Braganca et al. | |
| 9,110,746 B2 | 8/2015 | Zhu et al. | |
| 9,183,858 B2* | 11/2015 | Okawa | G01R 33/098 |
| 9,459,835 B2 | 10/2016 | Braganca et al. | |
| 9,577,653 B2* | 2/2017 | Buhrman | H03L 7/26 |
| 10,078,496 B2 | 9/2018 | Gupta et al. | |
| 2006/0114619 A1* | 6/2006 | Sbiaa | B82Y 10/00 360/324.12 |
| 2010/0131578 A1 | 5/2010 | Fukushima et al. | |
| 2010/0174766 A1 | 7/2010 | Weeks et al. | |
| 2011/0141629 A1 | 6/2011 | Braganca et al. | |
| 2012/0026784 A1 | 2/2012 | Kanai et al. | |

(Continued)

FOREIGN PATENT DOCUMENTS

JP 2011013901 A 7/2009

OTHER PUBLICATIONS

Mizrahi et al., "Neural-like computing with populations of superparamagnetic basis functions", Nature Communications | (2018) 9:1533 | DOI: 10.1038/s41467-018-03963-w.

(Continued)

*Primary Examiner* — Gene N Auduong

(57) ABSTRACT

A system for generating random noise includes a nanoscale magnetic device with two free ferromagnetic layers separated by a non-magnetic spacer layer. A current source directs a high current perpendicularly through the layers. The magnetic moments of the two free layers are excited by the spin transfer torque (STT) effect and continuously switch from a first direction to a second direction substantially antiparallel to said first direction with random transitions. The device output signal is a series of pulses with voltage peaks with random transition times between the peaks. The device output signal is input to a clipping circuit that cuts the signal off at certain voltage levels. A clocking circuit can sample the output of the clipping circuit to generate a random number.

20 Claims, 6 Drawing Sheets

(56) References Cited

U.S. PATENT DOCUMENTS

2014/0067890 A1 3/2014 Zhu et al.
2014/0108478 A1 4/2014 Lee et al.
2018/0254773 A1 9/2018 Yoshinari et al.
2019/0250887 A1 8/2019 Liu et al.

OTHER PUBLICATIONS

Zhu, "Spin Transfer Induced Noise in CPP Read Heads", IEEE Transactions on Magnetics, vol. 40, No. 1, Jan. 2004.
Platt, Charles, "Really, Really Random Number Generator", Makezine, May 1, 2015, 25 pages, downloaded from https://makezine.com/projects/really-really-random-number-generator/.
Fukushima, Akio et al., "Spin dice: A scalable truly random number generator based on spintronics", Applied Physics Express, Jul. 25, 2014, 5 pages, vol. 7, No. 8, Japan Society of Applied Physics.
International Search Report and Written Opinion for counterpart PCT/US2019/063448, dated May 5, 2020, 12 pages, ILPO.

* cited by examiner

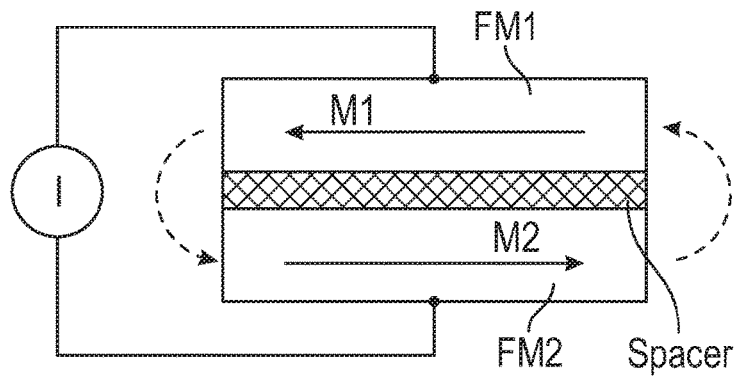

FIG. 2

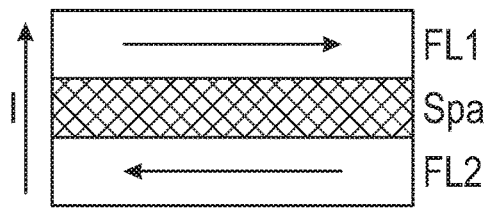

Torque Acting on FL1 Stabilizes
F1 and Torque Acting on FL2
Acts to Switch in into
Parallel State

FIG. 3A

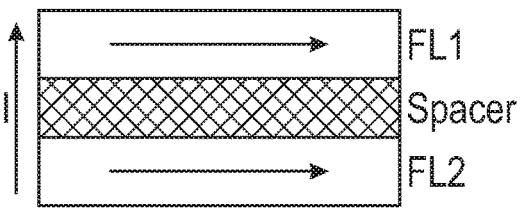

Torque Acting on FL1 Acts to
Switch F1 Into Antiparallel State
and Torque Acting on FL2
Stabilizes FL2

FIG. 3B

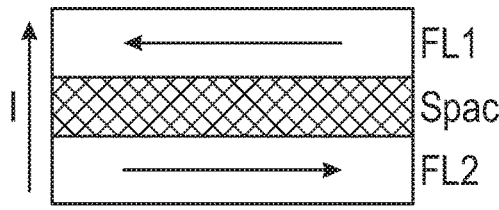

Torque Acting on FL1 Stabilizes
F1 and Torque Acting on FL2
Acts to Switch in into
Parallel State

FIG. 3C

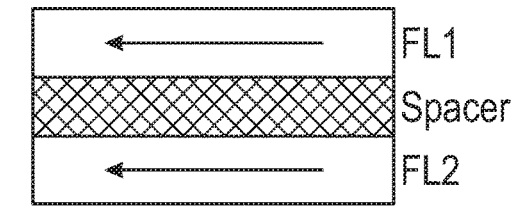

Torque Acting on FL1 Acts to
Switch F1 Into Antiparallel State
and Torque Acting on FL2
Stabilizes FL2

FIG. 3D

SYSTEM FOR GENERATING RANDOM NOISE WITH A MAGNETIC DEVICE

BACKGROUND

Field of the Invention

Embodiments of the invention relate generally to random noise generation, and more specifically to systems that generate random noise using nanoscale magnetic devices.

Description of the Related Art

The generation of truly random noise is of interest for a number of applications, such as random number generation for encryption, sampling or modeling, and more recently for neuromorphic computing using spiking schemes.

Magnetic tunnel junctions (MTJs) are nanoscale (i.e., in the range 10 s to 100 s of nanometers) magnetic devices that be integrated with ICs and CMOS circuits and have been proposed as a hardware-based approach to generating random noise. MTJs are used in a wide range of applications including magnetic sensing, hard disk drives, and magnetic random access memory (MRAM). A MTJ comprises two thin ferromagnetic (FM) layers separated by thin insulator layer, which is typically an oxide like MgO or a nitride. One of the FM layers is made so that the direction of its moment is difficult to change or is held "fixed", usually by coupling it to an antiferromagnet. The other FM layer is "free" to have the direction of its moment changed. This allows for well-defined states due to the magnetoresistance (MR) effect that allows detection of the orientation of the free layer's moment with respect to the fixed layer's moment based on the device resistance. While the orientation of the moment of the free layer can be changed using a magnetic field, more recently electric currents have been used to manipulate the orientation of the magnetic moment of the MTJ's free layer through an effect known as spin transfer torque (STT).

STT involves the interaction of a spin-polarized current (i.e., a current that has some large fraction of electrons with spins in the exact same direction) with a FM layer. Any one electron in the current will either pass through the FM layer or reflect off it. Quantum mechanics dictates that the probability is high that these interactions cause the electron spin to be oriented preferentially parallel or antiparallel to the direction of the FM layer's moment for transmitted and reflected electrons, respectively. However, the angular momentum lost by the rotation of the electron's spin must be conserved and therefore becomes a torque acting upon the moment of the FM layer. The torque from a single spin is small, but for a spin-polarized current on the order of only a mA there are approximately $10^{15}$ electrons interacting with the FM layer per second. So if the current is above a critical current, the net torque on the moment of the FM layer can be sufficient to induce the moment into an oscillatory mode, for example to form a spin-torque oscillator (STO). Even higher currents can flip the orientation of the moment of the FM layer. Thus in a STT-MRAM device the free layers in an array of MTJ memory cells can be switched between parallel and antiparallel orientations, thereby resulting in the individual MTJ cells representing either ones or zeros.

MTJs have been proposed for random number generation. U.S. Pat. No. 8,495,118 B2; U.S. Pat. No. 9,110,746 B2 and U.S. Pat. No. 10,078,496 B2 describe random number generators based on reading the state of a MTJ, i.e., detecting the orientation of the free layer moment, in response to thermal fluctuations or pulses of current greater than the critical current.

MTJs have also been proposed for generating random noise for use in neuromorphic computing. In neuromorphic computing, neurons in the brain can be mimicked by circuit elements that produce electrical spikes that can then be used as basis sets in training the system to perform certain tasks. Mizrahi et. al, "*Neural-like computing with populations of superparamagnetic basis functions*", Nature Communications 9, 1533 (2018), has discussed the use of superparamagnetic MTJs (MTJs where thermal fluctuations destabilize the state of the MTJ) as spiking elements by taking advantage of the random noise that naturally occurs in these devices.

SUMMARY

For MTJs that generate random noise the transition time from one state to the other (e.g., parallel to antiparallel moment orientation) is generally in the mid-millisecond to mid-microsecond range. Thus the transition rates are in the high kHz range. This relatively low frequency would severely slow certain random number applications and computation time for a neuromorphic computing application, as well as increase the power consumption of the system.

Embodiments of this invention use a nanoscale magnetic device with two free layers separated by a non-magnetic spacer layer that operates as a chaotic oscillator excited using the STT effect. The signal from the device is driven through a clipping circuit which cuts off the amplitude of the signal such that spikes are converted into square pulses with tens or hundreds of picosecond widths. The output of the clipping circuit can be passed to further processing circuitry for generating random numbers or random spikes.

For a complete understanding of the nature and advantages of the invention, reference should be made to the following detailed description taken together with the accompanying figures.

BRIEF DESCRIPTION OF THE DRAWING

FIG. 2 is a sectional view of a nanoscale magnetic device according to an embodiment of the invention.

FIGS. 3A-3D illustrate the sequence of moment orientations when a sufficiently high current is applied to the magnetic device according to an embodiment of the invention.

DETAILED DESCRIPTION

Embodiments of the system for generating random noise according to this invention use a nanoscale magnetic device that, unlike a MTJ, has two free layers separated by a non-magnetic spacer layer. The current perpendicularly through the free layers is high enough above the critical current so that the STT effect causes repeated flopping of the directions of the moments of each layer from one direction to an antiparallel direction. The reversal of the moment directions is a random process so the magnetic device can be operated as a chaotic oscillator.

Figure 1A:
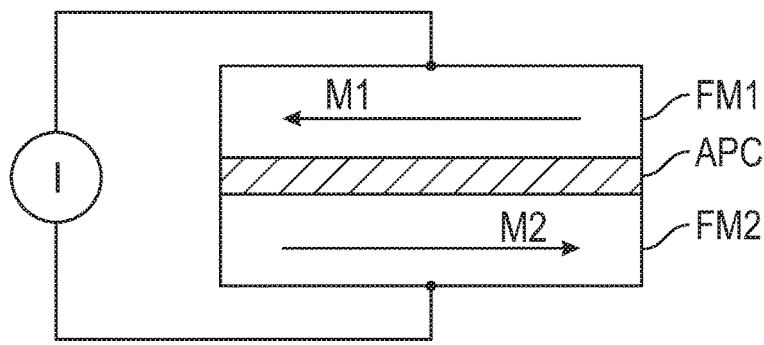
FIG. 1A is a sectional view of a nanoscale magnetic device with two free layers and an antiparallel coupling (APC) layer according to the prior art.
Figure 1B:
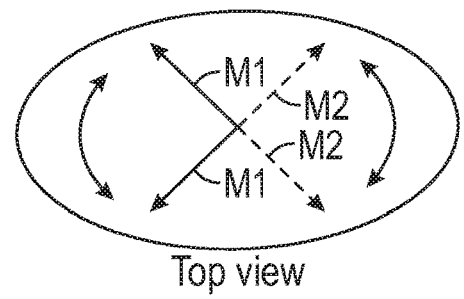
FIG. 1B is a top view illustration of the two scissor orientations of the moments in response to the current above the critical current for the prior art device of FIG. 1A.
Figure 1C:
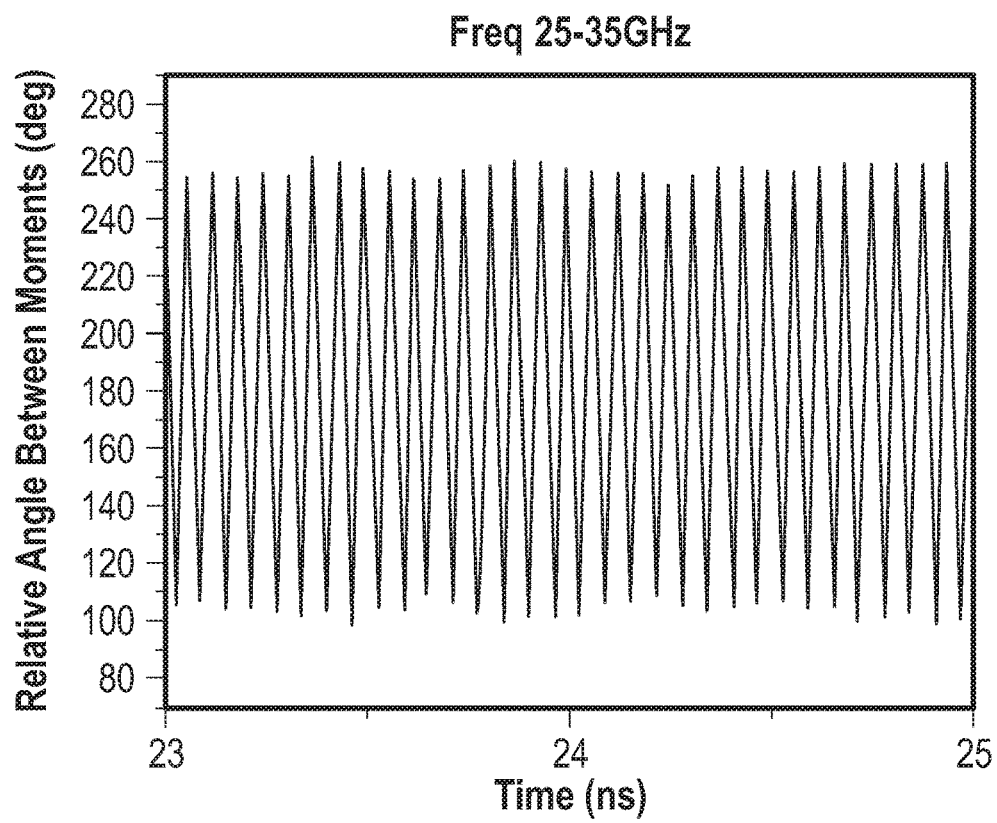
FIG. 1C is an illustration of the almost purely sinusoidal response of the device of FIG. 1A to a current above the critical current.

A nanoscale magnetic device with two free layers separated by an antiparallel coupling (APC) layer has been proposed as a STO magnetic field sensor, as described in U.S. Pat. No. 8,164,861 B2, which is assigned to the same assignee as this application. FIG. 1A is a sectional view of the prior art device. A current source generates current above the critical current value, which causes the moments (M1 and M2) of the two free layers (FM1 and FM2) to operate in a scissor mode and generate a signal on the order of 25-35 GHz. FIG. 1B is a top view illustration of the two scissor orientations of the moments in response to the current, with the moment M2 of the lower layer FM2 depicted with dashed lines. The frequency of oscillation changes in response to an applied magnetic field. The oscillations are periodic and almost purely sinusoidal, as shown by FIG. 1C, and thus would not work for generating random noise.

FIG. 2 is a sectional view of a nanoscale magnetic device according to an embodiment of the invention. A non-magnetic spacer layer that preferably provides no parallel coupling (no ferromagnetic interlayer exchange coupling) or no antiparallel coupling (no antiferromagnetic interlayer exchange coupling) between FM1 and FM2 separates FM1 and FM2. The magnetic device may have various shapes, including circular, elliptical (as depicted in FIG. 1B) and generally rectangular. The FM layers are typically formed of an alloy of one or more of Ni, Fe and Co. The spacer layer is a non-magnetic material. It may be a tunneling barrier layer formed of an oxide or nitride, as in a MTJ device, or a layer of an electrically-conducting metal or metal alloy, like metals or metal alloys of Cu, Ag, or Au, as in a current-perpendicular-to-the-plane (CPP) spin-valve device. In the quiescent state the moments are aligned preferably antiparallel as a result of the edge coupling shown by the dashed arrows. The current source generates a current substantially higher than the critical current and substantially higher than the current in the device shown in FIG. 1A. This results in repeated flopping of the moment directions of each layer. At these high current values reversal of the two moment directions is a random process and therefore a magnetic device with a dual free layer structure can be operated as a chaotic oscillator. FIGS. 3A-3D illustrate the sequence of moment orientations when a current is applied to the device sufficient to cause repeated flopping of the moments of each free layer from a first direction to a second direction substantially antiparallel to the first direction.

Micro-magnetic computer simulations were performed at zero temperature (no thermal effects on the device) to examine the moment dynamics that could be excited within a dual free layer structure with high current. Even at zero temperature, nondeterministic moment reversal for both free layers occurred for given simulation parameters, so the addition of thermal noise would only be expected to improve the random nature of the moment dynamics. The simulations modeled two FM layers (assumed to be CoFe with a saturation moment, $M_s$, of 1680 emu/cm$^2$) patterned into 40 nm circles with thicknesses of 4 nm and 2 nm, respectively and a spacer layer separation between them of 2 nm. The Gilbert damping for each layer was 0.014 and the spin polarization was assumed to be 60%. Simulations were run with interlayer coupling energy varied between 0 and $\pm 1 \times 10^{-3}$ J/m$^2$.

Figure 4A:
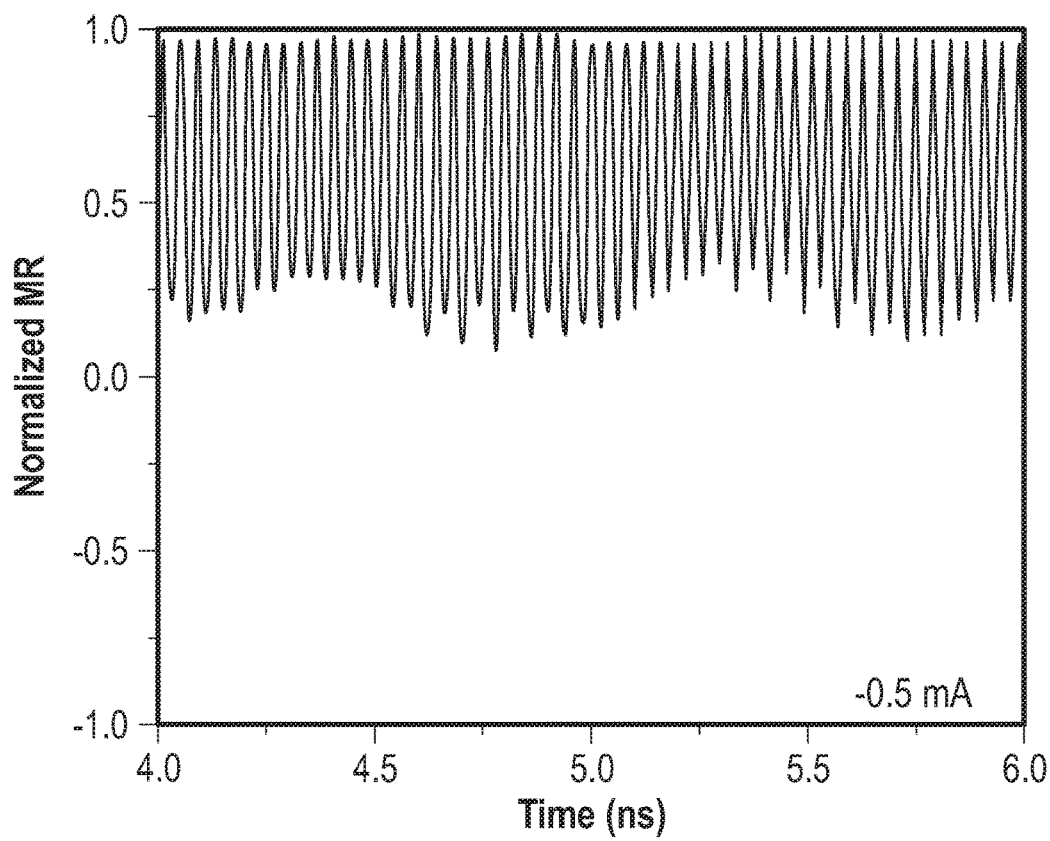
FIGS. 4A-4D illustrate the signal output from the magnetic device according to an embodiment of the invention for various current values.
Figure 4B:
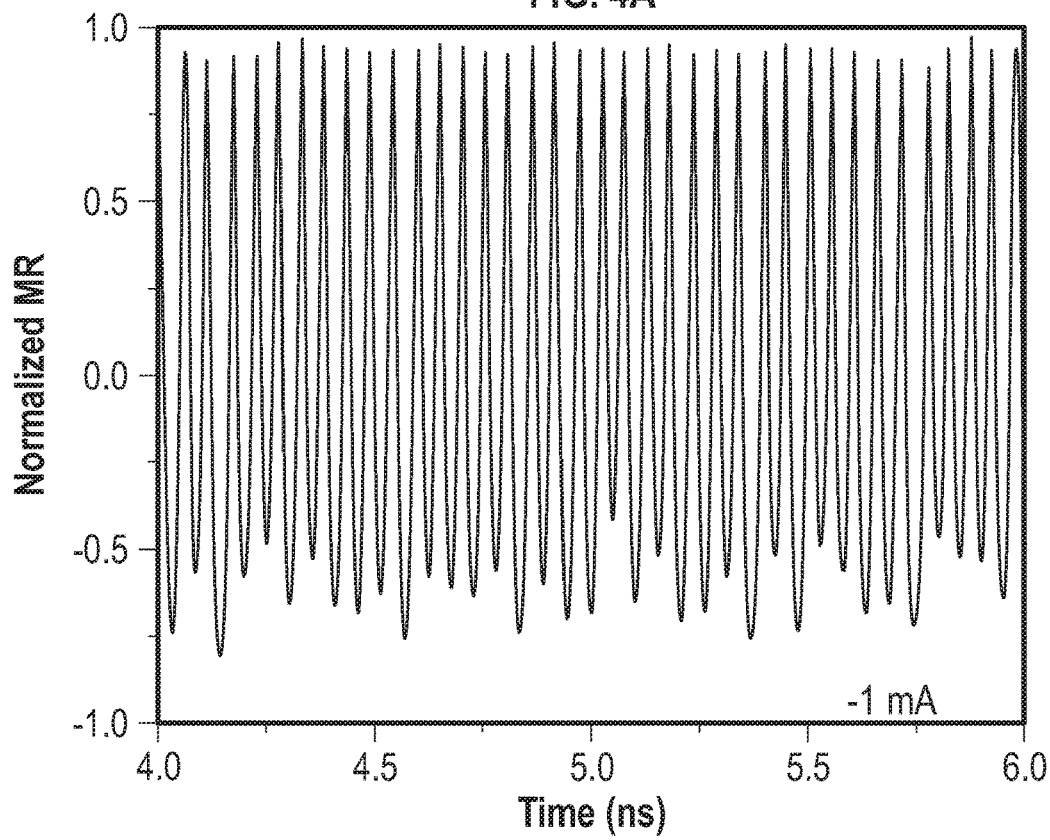
Figure 4C:
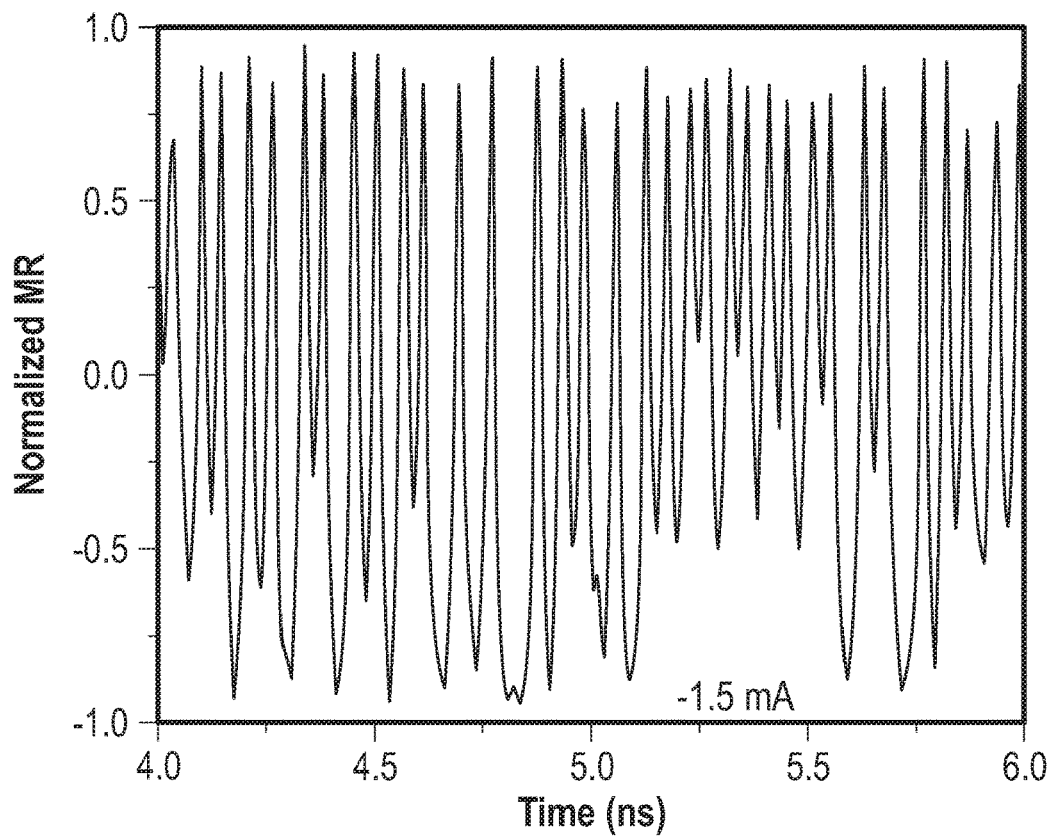
Figure 4D:
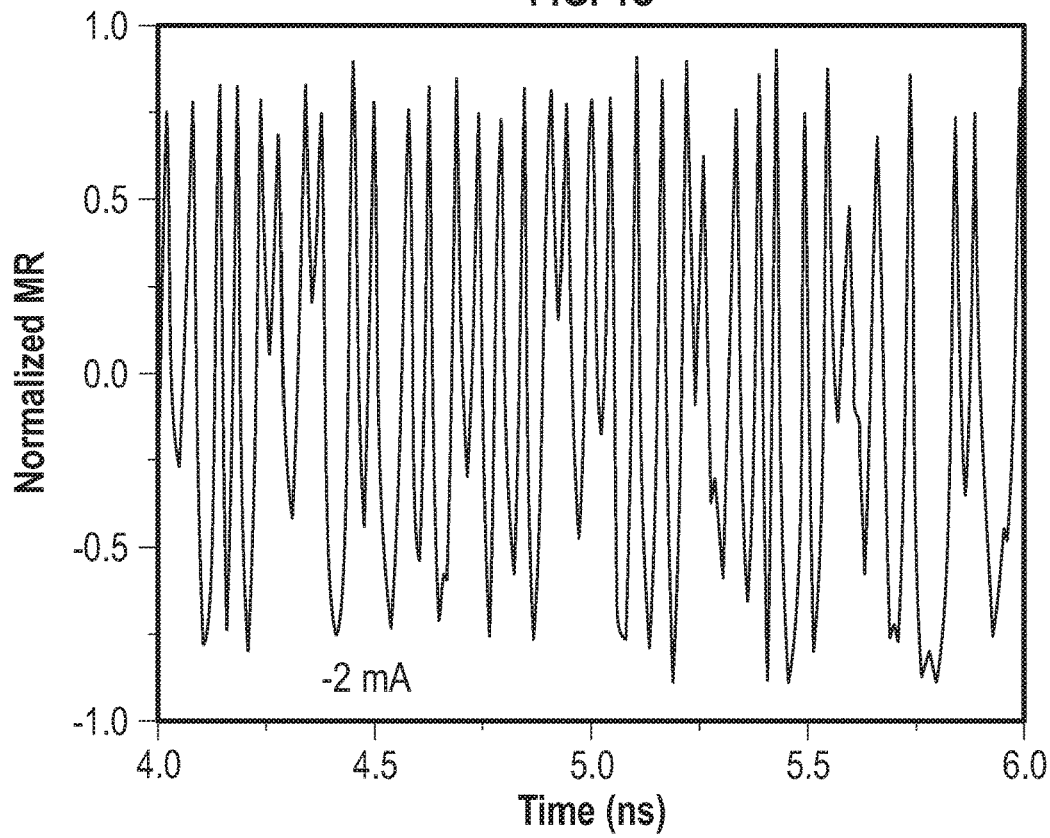

In FIGS. 4A-4D, results are shown for a range of currents between $-0.5$ and $-2$ mA run with no interlayer coupling between the FM layers and a 50 Oe magnetic field applied parallel to the planes of the FM layers. Normalized magnetoresistance (MR) is the cosine of the average angle between the two FM layers and negative current is defined as electrons moving from the thicker to the thinner FM layer. The dynamics of the two moment orientations results in a generally sinusoidal MR response at small currents ($-0.5$ mA, $-1$ mA; FIGS. 4A, 4B respectively). These current values are thus equal to or greater than the critical current, which is the current required to induce the moments into an oscillatory mode. As the current is increased to higher levels above the critical current ($-1.5$ mA, $-2$ mA; FIGS. 4C, 4D respectively) the transitions between parallel and antiparallel states for each moment become more and more irregular. In this state, the oscillator transitions are chaotic and have lifetimes in the 10-100 picosecond range.

While in the preferred embodiment the non-magnetic spacer layer provides no interlayer coupling, spacer layers with small interlayer coupling may be used to modify the lifetimes of the two oscillator states. When using an APC spacer layer, the response was sinusoidal for low currents ($-1$ mA). However, with an APC spacer layer with $-1 \times 10^{-4}$ J/m$^2$ coupling strength, the response was irregular at $-2$ mA. Also, for parallel coupling spacer layers with coupling strengths $+5 \times 10^{-5}$ J/m$^2$ to $+5 \times 10^{-4}$ J/m$^2$ and higher currents ($-1.5$ mA or greater) the response was irregular. Thus, APC or parallel coupling spacer layers will still result in the desired irregular moment dynamics if the current is high enough. Changing both current and applied field can provide some tuning of the dynamics to affect the ratio of transition rates between the parallel and antiparallel states of the moments. The current required to induce the chaotic oscillation of the free layer moments depends on several factors, including the saturation magnetization, FM layer volume, anisotropy field and Gilbert damping, and can be determined experimentally or by micro-magnetic computer simulation. If an external magnetic field is to be applied during operation of the device, it is applied in a direction parallel to the orientation of the moments when the device is in its quiescent state (i.e., no current from the current source). The magnetic device can be located adjacent a permanent magnet or electromagnet that applies the external magnetic field. An applied magnetic field during operation is optional; it is not a requirement as the modeling shows similar irregular dynamics at zero applied field.

While the FM materials in the modeling had a $M_s$ of 1680 emu/cm$^2$, magnetic materials with much smaller $M_s$ can be used to lower the current required to achieve the irregular dynamics of the device. While the modeling here considered FMs with in-plane magnetic moments, the device can have FMs with their moments perpendicular to the plane using a phenomenon known as perpendicular magnetic anisotropy.

The magnetic device for random noise generation according to the above-described embodiments can be made small, e.g. in the 10-20 nm nanoscale range, and is compatible with CMOS circuits. The device has transition rates at frequencies up to 20-30 GHz, which are substantially higher than previous transition rate frequencies seen for randomly generated pulse trains. The device can be operated at relatively low power, and includes the ability to tune the properties of the noise.

Figure 5:
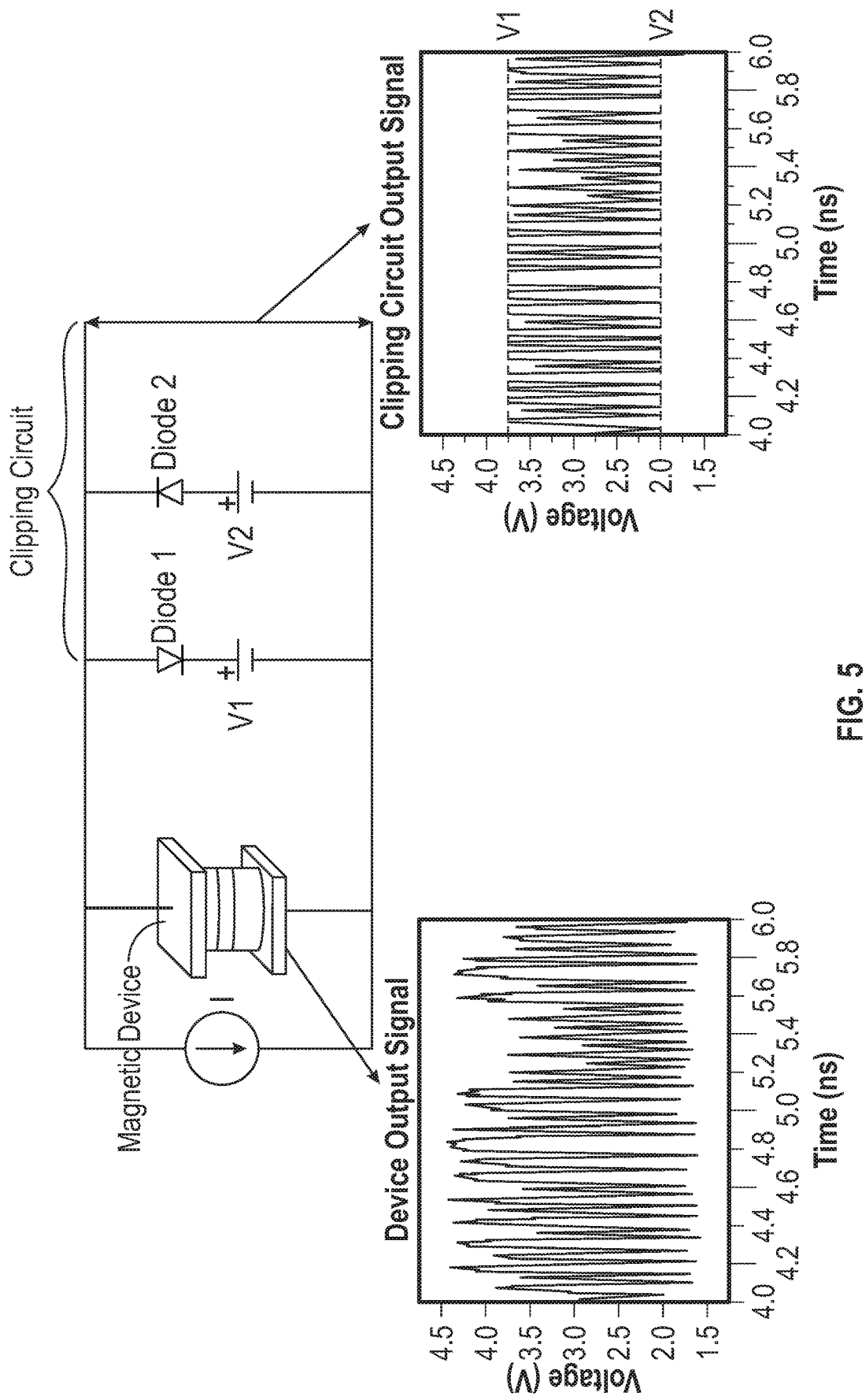
FIG. 5 is an illustration showing the magnetic device according to an embodiment of the invention connected to a clipping circuit, together with the device output signal and the clipping circuit output signal.

While a magnetic device that can randomly transition between two states for generating random noise has been described above, the subsequent response can be shaped into a signal more like square pulses. That can be achieved using some type of clipping circuit using nonlinear elements, such as diodes or transistors, that takes the signal from the magnetic device and cuts the signal off at certain voltage levels. One example of a clipping circuit is shown in FIG. 5. Conventional circuitry like a voltage detector connected to the device detects the output signal (left side of FIG. 5) as voltage pulses with irregular pulse amplitudes. The upper or lower signal peaks depend on the state of the device flipping back and forth between states where the moments of the two FMs are close to being either parallel (see FIGS. 3B and 3D) or antiparallel (see FIGS. 3A and 3C). The device output signal is sent through a clipping circuit with two diodes in parallel but with the anode of one adjacent to the cathode of the other, with each diode biased by a voltage V1 and V2, respectively. The voltages V1 and V2 are chosen to be within the maximum and minimum of the signal (bottom left side of FIG. 5) such that they cut off the signal between those voltages and flatten out the pulses (bottom right side of FIG. 5). The device output signal can be sent through an amplifier prior to the clipping circuit (not shown) if a larger signal is required. The output of the clipping circuit can be sent to additional detection electronics (for example, clamping circuits, ADCs, etc.) as required for the application. FIG. 5 is just one example of a clipping circuit. In this manner, random noise can be generated at transition frequencies greater than 1 GHz in a reliable way.

Figure 6:
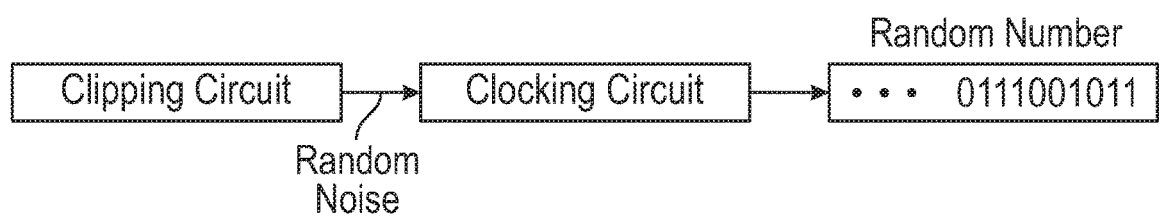
FIG. 6 is a schematic showing the clipping circuit output connected to a clocking circuit for generating a random number.

FIG. 6 is a schematic showing how the random noise generator (the clipped voltage pulses with random transitions from the clipping circuit) is used to generate a random number expressed as a binary number. A clocking circuit with a clock rate faster than the shortest transition time is applied to the clipping circuit output. At each clock pulse the clipping circuit output is sampled and detected as either a V1 or V2 voltage and the detected voltage is converted to a corresponding 0 or 1. The number of clock cycles can be selected to correspond to the length of the desired random number.

Figure 7:
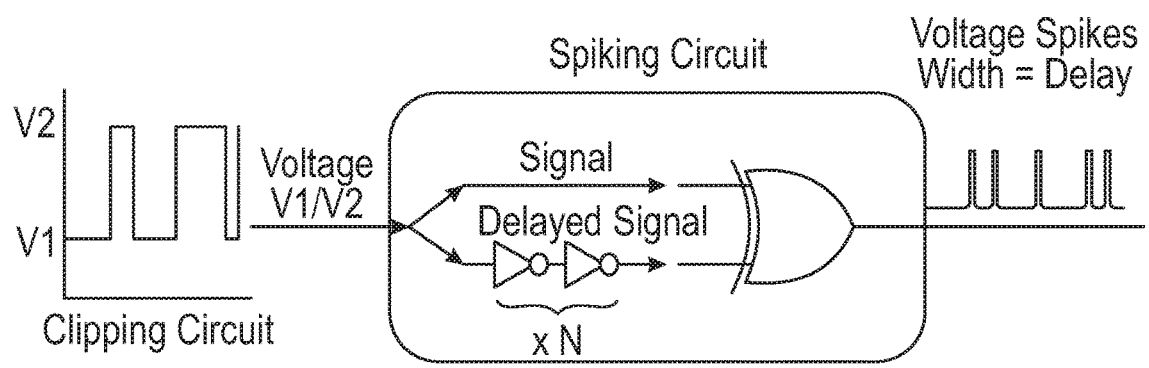
FIG. 7 is a schematic showing the clipping circuit connected to a spiking circuit for generating random spikes.

FIG. 7 is a schematic showing how the random noise generator (the clipped voltage pulses with random transitions from the clipping circuit) is used to generate random spikes, as may be used in neuromorphic computing. A spiking circuit includes an XOR gate that receives the V1 and V2 pulses from the clipping circuit and a delayed signal to generate voltage spikes with a fixed width corresponding to the delay.

While the invention has been particularly shown and described with reference to the preferred embodiments, it will be understood by those skilled in the art that various changes in form and detail may be made without departing from the spirit and scope of the invention.

Accordingly, the disclosed invention is to be considered merely as illustrative and limited in scope only as specified in the appended claims.

What is claimed is:

1. A system for generating random noise, the system comprising:
   a magnetic device comprising:
   a first ferromagnetic free layer having a moment substantially free to rotate in the presence of an external magnetic field;
   a second ferromagnetic free layer having a moment substantially free to rotate in the presence of an external magnetic field; and
   a non-magnetic spacer layer between the first and second free layers;
   a current source electrically coupled to the magnetic device for directing electrical current substantially perpendicularly through the layers of the magnetic device, the current source being adapted to supply current sufficient to cause the magnetic device to operate as a chaotic oscillator by causing the moment of each of the first and second free layers to repeatedly and randomly switch from a first direction to a second direction substantially antiparallel to said first direction; and
   electrical circuitry coupled to the magnetic device for detecting a signal in response to changes in moment direction of the first and second free layers.

2. The system of claim 1 wherein the spacer layer comprises an electrically-conducting metal or metal alloy layer.

3. The system of claim 1 wherein the spacer layer comprises a tunneling barrier layer selected from an oxide and a nitride.

4. The system of claim 1 wherein the spacer layer comprises a coupling layer for coupling the first and second ferromagnetic layers with their moments oriented substantially antiparallel in the absence of an external magnetic field.

5. The system of claim 1 wherein the spacer layer comprises a coupling layer for coupling the first and second ferromagnetic layers with their moments oriented substantially parallel in the absence of an external magnetic field.

6. The system of claim 1 wherein the moment of the second free layer is oriented substantially antiparallel to the moment of the first free layer in the absence of an external magnetic field.

7. The system of claim 1 wherein the moments of the first and second free layers are oriented substantially in the plane of the free layers in the absence of an external magnetic field.

8. The system of claim 1 wherein the moments of the first and second free layers are oriented substantially perpendicular to the plane of the free layers in the absence of an external magnetic field.

9. The system of claim 1 further comprising a clipping circuit for limiting positive and negative peaks of said detected signal.

10. The system of claim 9 further comprising a clocking circuit coupled to the clipping circuit for generating a binary number from the limited positive and negative signal peaks.

11. The system of claim 9 further comprising a spiking circuit coupled to the clipping circuit for generating random spikes.

12. The system of claim 1 further comprising a magnet located adjacent the magnetic device, the magnet adapted for applying a magnetic field in a direction substantially parallel to the quiescent orientation of the moments of the first and second free layers.

13. A system for generating random noise, the system comprising:
   a magnetic device comprising:
   a first ferromagnetic free layer having a moment substantially free to rotate in the presence of an external magnetic field;

a second ferromagnetic free layer having a moment substantially free to rotate in the presence of an external magnetic field, the moment of the second free layer being oriented substantially antiparallel to the moment of the first free layer in the absence of an external magnetic field, wherein the moments of the first and second free layers are oriented substantially in the plane of the free layers in the absence of an external magnetic field; and a non-magnetic spacer layer between the first and second free layers;

a current source electrically coupled to the magnetic device for directing electrical current substantially perpendicularly through the layers of the magnetic device, the current source being adapted to supply current sufficient to cause the magnetic device to operate as a chaotic oscillator by causing the moment of each of the first and second free layers to repeatedly and randomly switch from a first direction to a second direction substantially antiparallel to said first direction;

electrical circuitry coupled to the magnetic device for detecting a signal in response to changes in moment direction of the first and second free layers; and a clipping circuit for limiting positive and negative peaks of said detected signal.

14. The system of claim 13 wherein the spacer layer comprises an electrically-conducting metal or metal alloy layer.

15. The system of claim 13 wherein the spacer layer comprises a tunneling barrier layer selected from an oxide and a nitride.

16. The system of claim 13 wherein the spacer layer comprises a coupling layer for coupling the first and second ferromagnetic layers with their moments oriented substantially antiparallel in the absence of an external magnetic field.

17. The system of claim 13 wherein the spacer layer comprises a coupling layer for coupling the first and second ferromagnetic layers with their moments oriented substantially parallel in the absence of an external magnetic field.

18. The system of claim 13 further comprising a clocking circuit coupled to the clipping circuit for generating a binary number from the limited positive and negative signal peaks.

19. The system of claim 13 further comprising a magnet located adjacent the magnetic device, the magnet adapted for applying a magnetic field in a direction substantially parallel to the quiescent orientation of the moments of the first and second free layers.

20. A system for generating a random number, the system comprising:

means for directing electrical current substantially perpendicularly through a plurality of ferromagnetic free layers of a magnetic device, the current source being to supply current sufficient to cause the magnetic device to operate as a chaotic oscillator by causing the moment of each of the free layers to repeatedly and randomly switch from a first direction to a second direction substantially antiparallel to the first direction;

means for detecting a signal in response to changes in moment direction of the free layers;

means for limiting positive and negative peaks of the detected signal; and means for generating a binary number from the limited positive and negative signal peaks.

* * * * *